(12) United States Patent
Zhou et al.

(10) Patent No.: US 8,896,810 B2
(45) Date of Patent: Nov. 25, 2014

(54) LIQUID IMMERSION SCANNING EXPOSURE SYSTEM USING AN IMMERSION LIQUID CONFINED WITHIN A LENS HOOD

(75) Inventors: Wenzhan Zhou, Singapore (SG); Sia Kim Tan, Singapore (SG); Lei Yuan, Singapore (SG); Meisheng Zhou, Singapore (SG)

(73) Assignee: Globalfoundries Singapore PTE. Ltd., Singapore (SG)

( * ) Notice: Subject to any disclaimer, the term of this patent is extended or adjusted under 35 U.S.C. 154(b) by 1028 days.

(21) Appl. No.: 12/649,212

(22) Filed: Dec. 29, 2009

(65) Prior Publication Data

US 2011/0157567 A1    Jun. 30, 2011

(51) Int. Cl.
*G03B 27/42* (2006.01)

(52) U.S. Cl.
USPC ............. 355/53; 355/30; 355/72; 355/77

(58) Field of Classification Search
CPC ..... G03F 7/20; G03F 7/2041; G03F 7/70341; G03F 7/0035; G03F 7/11; G03F 7/422; G03F 7/7015; G03F 7/7085; G03F 9/7026; G03F 9/7096; H05K 7/20236; H05K 1/06306; H05K 3/3436

USPC ................................ 355/30, 53, 72, 77
See application file for complete search history.

(56) References Cited

U.S. PATENT DOCUMENTS

2005/0068499 A1* 3/2005 Dodoc et al. .............. 353/10
2008/0074634 A1* 3/2008 Binnard ..................... 355/73

\* cited by examiner

*Primary Examiner* — Mesfin T Asfaw

(57) ABSTRACT

A liquid immersion scanning exposure system utilizes an immersion liquid confined within a watertight lens hood having a base portion formed from a solid optical element. During operation, a bottom portion of a lens assembly is disposed within the immersion liquid and the solid optical element is placed upon a photoresist material or layer (to be patterned). The lens assembly moves laterally through the immersion liquid parallel to the photoresist material. Because the solid optical element separates the immersion liquid from the photoresist material and does not move relative to the photoresist material, the photoresist material does not contact with the immersion liquid and the solid optical element and is not susceptible to damage or scratching by the solid optical element.

20 Claims, 3 Drawing Sheets

LIQUID IMMERSION SCANNING EXPOSURE SYSTEM USING AN IMMERSION LIQUID CONFINED WITHIN A LENS HOOD

TECHNICAL FIELD

The present disclosure relates generally to the manufacture of semiconductor devices, and more particularly, to the manufacture of integrated circuits using immersion lithography.

BACKGROUND

As the size of integrated circuit line widths continue shrinking to as low as forty five nanometers (45 nm), utilization of immersion lithography is becoming more and more common. To provide a better understanding of the principles of immersion lithography, a prior art dry optics lithography system will first be described.

FIG. 1 illustrates an exemplary arrangement of a prior art dry optics lithography system 100 for performing a lithography process on a photoresist material 110. As shown in FIG. 1, dry optics lithography system 100 includes a first lens 120, a second lens 130, and a third lens 140. The three lenses 120, 130, and 140 are aligned along a vertical optical axis 150 perpendicular to a top surface of the photoresist material 110. An air gap 160 is disposed between the top surface of the photoresist material 110 and the bottom surface of the first lens 120.

In an dry optics lithography system of the type illustrated in FIG. 1, the numerical aperture (NA) is given by the expression NA=sin θ, where θ is the angle between the vertical optical axis 150 and the outermost optical ray 170 that passes through the dry optics system 100. The numerical aperture (NA) is a dimensionless number that characterizes the range of angles over which an optical system can accept or emit light.

FIG. 2 illustrates an exemplary arrangement of a prior art immersion lithography optics system 200 for performing a lithography process on a photoresist material 210. As shown in FIG. 2, the immersion lithography optics system 200 includes a first lens 220, a second lens 230, and a third lens 240. The three lenses 220, 230, and 240 are aligned along a vertical optical axis 250 perpendicular to a top surface of the photoresist material 210. A gap 260 disposed between the top surface of the photoresist material 210 and the bottom surface of the first lens 220 is filled with an immersion material 270. The immersion material may be either a liquid or a solid.

According to the theory of immersion lithography, the immersion material 270 filling the gap 260 between the first lens 220 and the photoresist material 210 reduces phase error of the incident ray and helps increase depth of focus (DOF) and resolution of the optical system.

In an immersion optics system of the type illustrated in FIG. 2, The numerical aperture (NA) is given by the expression NA=n sin θ, where θ is the angle between the vertical optical axis 250 and the outermost optical ray 280 that passes through the immersion lithography optical system 200 and where the letter "n" designates the value of the index of refraction of the immersion material 270.

When the immersion material 270 is a liquid, several practical production problems may occur. These problems include a leaching effect, a liquid evaporation cooling effect, an immersion defect, and so on. For at least some of these reasons, a solid is sometimes utilized for the immersion material 270 and the process is referred to as solid immersion lithography.

In solid immersion lithography, the solid immersion material 270 is in direct contact (or in close proximity to) the photoresist material 210. This makes it difficult to have relative motion between the lens assembly and the photoresist material 210 without scratching the surface of the photoresist material 210 which makes it virtually impossible to engage in high speed scanning. This also limits the throughput of the process.

Accordingly, there is a need in the art for an improved immersion lithography apparatus and method that remedies the above described deficiencies of the prior art.

SUMMARY

In accordance with one embodiment, there is provided a liquid immersion scanning system including a watertight lens hood having a bottom portion and a plurality of wall portions defining an interior volume.

In accordance with another advantageous embodiment, a liquid immersion scanning exposure system is provided that uses an immersion liquid confined within a watertight lens hood. A bottom portion of a lens assembly is disposed within the immersion liquid within the watertight lens hood. The watertight lens hood includes a base portion formed from a solid optical element. The solid optical element is placed upon a photoresist layer and the lens assembly is moved laterally through the immersion liquid parallel to the photoresist layer.

In accordance with yet another embodiment, there is provided a method for operating a liquid immersion scanning system. The method includes providing a watertight lens hood, placing a lens assembly within the watertight lens hood, and operating the lens assembly within the watertight lens hood.

In another embodiment, there is provided another method for operating a liquid immersion scanning system. the method includes providing a watertight lens hood having a bottom portion and a plurality of wall portions defining an interior volume, the bottom portion including a solid optical element; placing an immersion liquid within the watertight lens hood; placing a lens assembly within the immersion liquid within the watertight lens hood; and operating the liquid immersion scanning system by moving the lens assembly laterally within the immersion liquid within the watertight lens hood.

A major advantage of this system and method is that the immersion liquid does not come into contact with the photoresist material layer because the liquid remains contained within the watertight lens hood. As a result, the photoresist layer remains dry at all times. This overcomes the shortcomings of the conventional liquid immersion process.

Another major advantage of this system and method is that the solid optical element is in direct contact with the top surface of the photoresist layer. Therefore, no focus or leveling metrology is needed and focus variation can be minimized.

The foregoing has outlined rather broadly the features and technical advantages of the present disclosure so that those skilled in the art may better understand the detailed description that follows. Additional features and advantages will be described hereinafter that form the subject of the claims. Those skilled in the art should appreciate that they may readily use the conception and the specific embodiment disclosed as a basis for modifying or designing other structures for carrying out the same purposes as the present disclosure. Those skilled in the art should also realize that such equivalent constructions do not depart from the spirit and scope in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
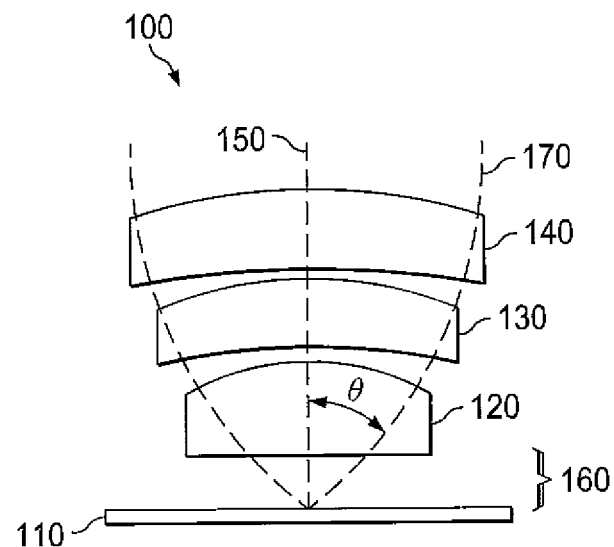
FIG. 1 is a diagram illustrating an exemplary arrangement of a prior art dry optics lithography system utilized to perform a lithography process on a photoresist material.
Figure 2:
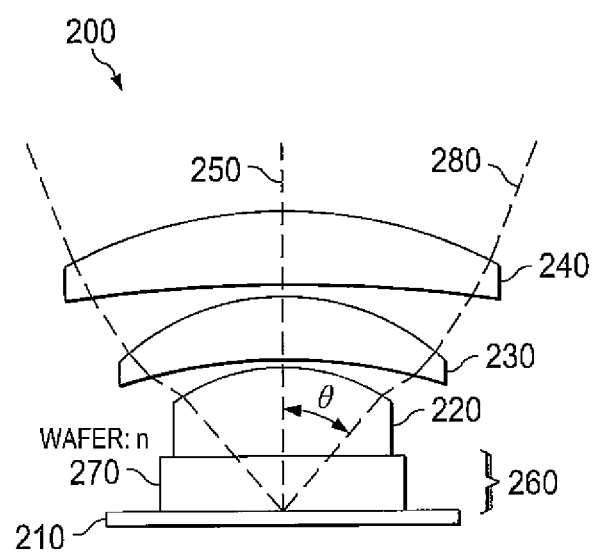
FIG. 2 illustrates an exemplary arrangement of a prior art immersion lithography optics system utilized to perform a lithography process on a photoresist material.
Figure 3:
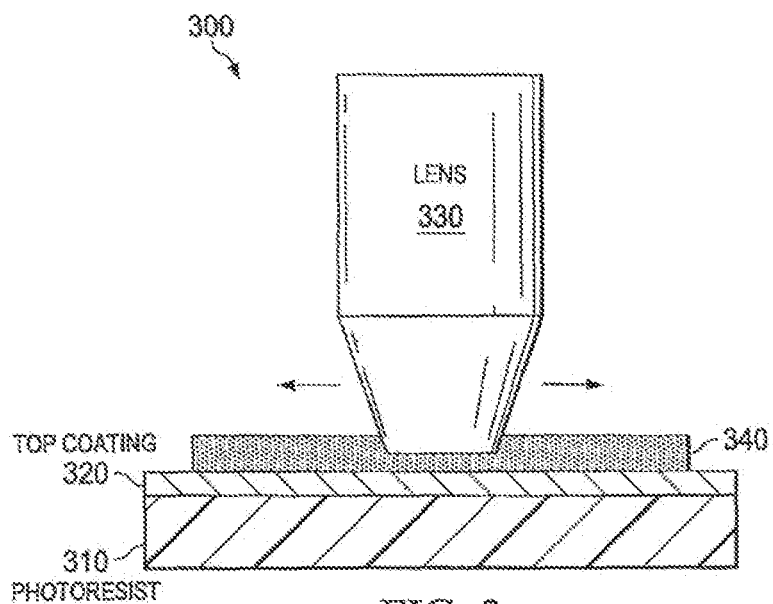
FIG. 3 illustrates an exemplary arrangement of a prior art liquid immersion optics system in which a lens assembly is moved (or scanned) within an immersion liquid located over an underlying photoresist material.
Figure 4:
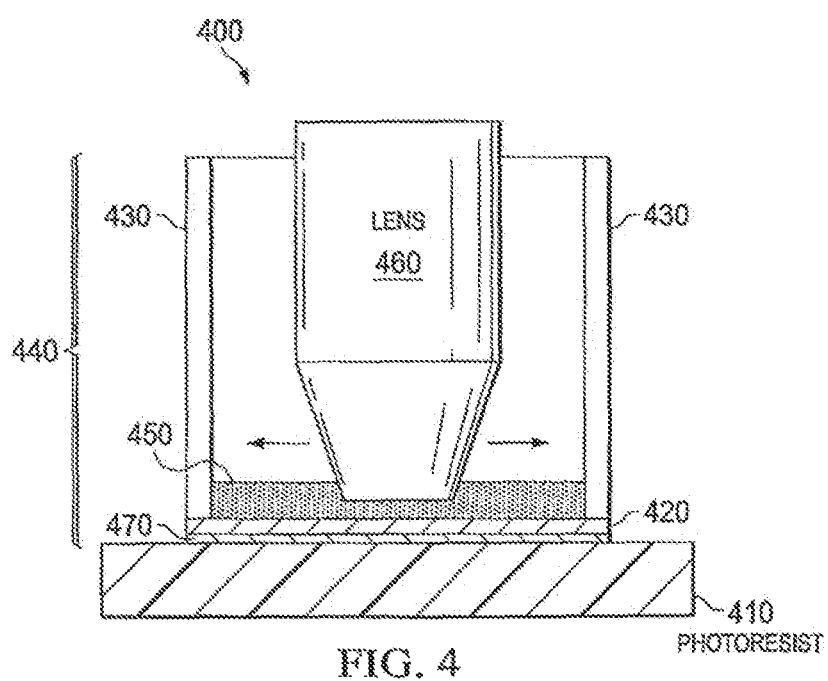
FIG. 4 illustrates an exemplary arrangement of a liquid immersion optics system in accordance with the present disclosure in which a lens assembly is moved (or scanned) within an immersion liquid confined within a lens hood and a solid material is disposed over an underlying photoresist material.
Figure 5:
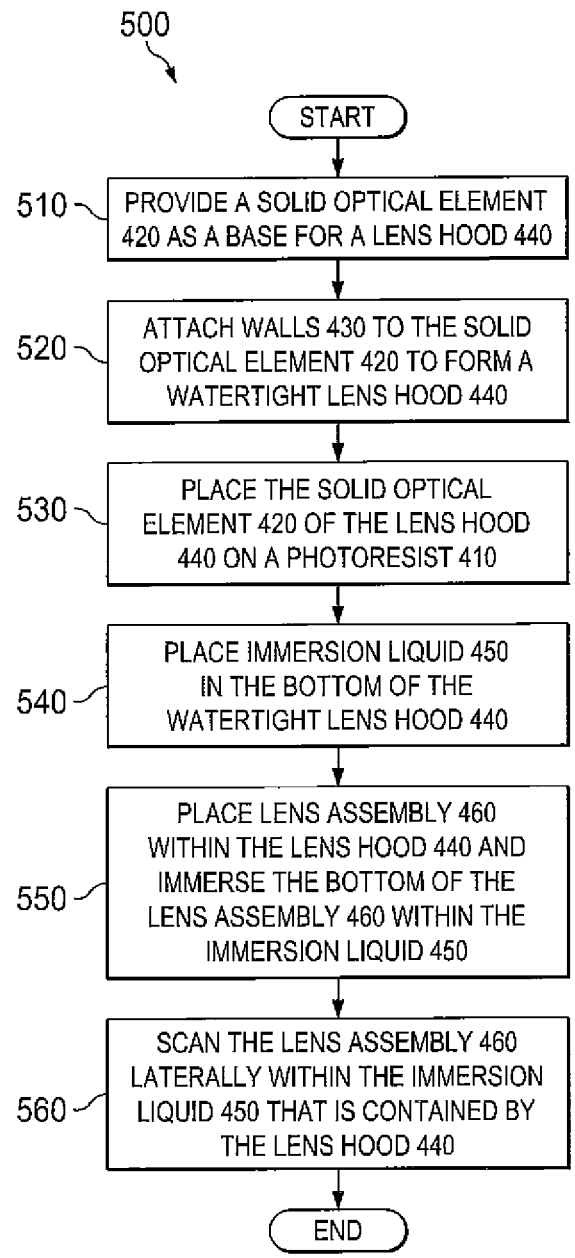
FIG. 5 is a diagram illustrating a flowchart of an advantageous embodiment of a method of the present disclosure.

FIGS. 3 through 5 and the various embodiments used to describe the principles of the present disclosure in this patent document are by way of illustration only and should not be construed in any way to limit its scope. Those skilled in the art will understand that these principles may be implemented in any type of suitably arranged immersion lithography apparatus.

To simplify the drawings the reference numerals from previous drawings will sometimes not be repeated for structures that have already been identified.

To better provide a thorough explanation of the technical advantages, a description of a prior art liquid immersion optics system will first be given.

FIG. 3 illustrates an exemplary arrangement of a prior art liquid immersion optics system 300. In the exemplary arrangement shown in FIG. 3, a layer of photoresist material 310 is covered with a top coating 320. A lens assembly 330 (designated with the word "Lens" in FIG. 3) is positioned over the top surface of the top coating 320 in such a manner that a gap is formed between the bottom surface of the lens assembly 330 and the top surface of the top coating 320.

An immersion liquid 340 (e.g., water 340) is placed over the top coating 320 and fills the gap between the bottom surface of the lens assembly 330 and the top surface of the top coating 320. The lens assembly 330 is capable of and operable for being moved (or scanned) laterally with respect to the top surface of the top coating 320 to achieve a whole field exposure.

The immersion liquid 340 directly contacts the bottom surface of the lens assembly 330 and the top surface of the top coating 320. This causes a number of physical and chemical reactions to occur during exposure to the immersion liquid 340. These physical and chemical reactions will sometimes negatively impact the process performance in terms of focus, overlay, defects, etc. As will be seen, these problems may be avoided by using the apparatus and method of the present disclosure described below.

FIG. 4 illustrates an exemplary arrangement of a liquid immersion optics system 400 in accordance with the present disclosure. As shown in FIG. 4, an underlying layer of photoresist material 410 is provided (the photoresist material is utilized for masking purposes during an integrated circuit manufacturing process). The system 400 includes a lens hood 440 and a lens assembly 460. The lens hood 440 includes a solid optical element 420 forming a base portion and a plurality of walls 430 attached or coupled to outer edges of the solid optical element 420. When assembled, these components form a watertight (or liquid impervious) container (i.e., the lens hood 440). The solid optical element 420 forms the base of the lens hood 440 and the junctures between the walls 430 of the lens hood 440 and the solid optical element 420 are watertight (or liquid impervious) so that the lens hood 440 structured and operable to contain an immersion liquid 450 within the lens hood 440 without leakage. Thus, the base and walls are structured to define an interior volume which holds or contains the immersion liquid 450 (and at least a portion of the lens assembly 460).

The lens assembly 460 (designated with the word "Lens" in FIG. 4) is positioned above the top surface of the solid optical element 420 of the lens hood 440, and in such a manner so as to form a gap between the bottom surface of the lens assembly 460 and the top surface of the solid optical element 420.

The immersion liquid 450 is disposed (or contained or confined) within the lens hood 440 to fill the gap between the bottom surface of the lens assembly 460 and the top surface of the solid optical element 420. The lens assembly 460 is capable of being moved (or scanned) laterally with respect to the top surface of the solid optical element 420 to achieve a whole field exposure while the bottom portion of the lens assembly 460 is immersed in the immersion liquid 450 and moves within the lens hood 460. The solid optical element 420 (and lens hood 440) is stationary (does not move) during the scan exposure of the lens assembly 460.

As will be appreciated, the type or composition of the immersion liquid 450 may be any type or composition suitable for the process utilized. For example, and without limitation, the immersion liquid 450 may be water, argon fluoride, or a combination thereof.

In one embodiment, the solid optical element 420 is selected to have an index of refraction that equals (or substantially equals) the index of refraction of the photoresist material 410 and/or that equals (or substantially equals) the index of refraction of the immersion liquid 450. In other embodiments, each index of refraction for the optical element 420, photoresist material 410 and the immersion liquid 450 may be different. For example, the optical element 420 may be CaF (calcium fluoride), or LuAG (lutetium aluminum garnet) for high index immersion lithography.

In one embodiment, the solid optical element 420 directly contacts the top surface of the photoresist material 410. In another embodiment, the solid optical element 420 contacts a buffer layer 470 formed on top of the photoresist material 410. The buffer layer 470, for example, may be an organic material that blocks components leaching from the photoresist that may contaminate the lens hood. In one embodiment, the buffer layer 470 may have a thickness in the range of between about 200 to about 300 nm.

One major advantage of the system 400 is that the immersion liquid 450 does not come into contact with the photoresist material 410 and remains dry. The immersion liquid 450 remains contained or confined within the lens hood 440. This overcomes the shortcomings of the conventional liquid immersion process.

Another major advantage of the system 400 is that the solid optical element 420 directly contacts the top surface of the photoresist material 410. Therefore, no focus or leveling metrology is needed, and focus variation can be minimized.

Another major advantage of the present invention is that because the immersion liquid 470 does not come into contact with the photoresist material 410, no top coating (such as top coating 320 in FIG. 3) is needed to protect the photoresist material 410 from leaching. This means that the cost of providing a top coating may be eliminated in the immersion process of the present invention.

Surface contamination may occur due to the contact between the solid optical element 420 and the underlying photoresist material 410. This problem may be overcome by applying a thin layer of an anti-adhesion film (e.g., the buffer layer 470) on the top surface of the photoresist material 410 or the bottom surface of the solid optical element 420. The presence of a thin layer of an anti-adhesion film minimizes the surface contamination. In one example, the anti-adhesion film may be Teflon or Teflon-like material.

FIG. 5 is a diagram illustrating a flowchart 500 of an advantageous embodiment of a method in which the system 400 may be utilized for liquid immersion scanning using an immersion liquid confined within a lens hood.

The solid optical element 420 is provided as a base for the lens hood 440 (step 510). Walls 430 are attached to the solid optical element 420 to form a watertight (or liquid impervious) lens hood 440 (step 520). The solid optical element 420 of the lens hood 440 is placed on the surface of a photoresist material (step 530).

The immersion liquid 450 is disposed or placed in the bottom of the watertight lens hood 440 (step 540) to a level at which a bottom portion of the lens assembly 460 is or will be immersed. The lens assembly 460 is placed within the lens hood 440 and the bottom of the lens assembly 460 is immersed within the immersion liquid 450 (step 550). Conventional operation of the lens assembly 460 is performed, such as scanning laterally within the immersion liquid 450 contained within the lens hood 440 (step 560).

It will be understood that well known processes have not been described in detail and have been omitted for brevity. Although specific steps (and not necessarily occurring in the order described), structures and materials may have been described, the present disclosure may not limited to these specifics, and others may be substituted as is well understood by those skilled in the art.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A liquid immersion scanning system comprising:
a watertight lens hood having a bottom portion and a plurality of wall portions defining an interior volume, wherein the bottom portion of the watertight lens hood comprises a solid optical element positioned above a top surface of a photoresist material, wherein the solid optical element is in direct contact with the to surface of the photoresist material.

2. The liquid immersion scanning system as set forth in claim 1 further comprising:
an immersion liquid within the watertight lens hood.

3. The liquid immersion scanning system as set forth in claim 2 further comprising:
a lens assembly at least partially disposed within the watertight lens hood.

4. The liquid immersion scanning system us set forth in claim 3 wherein a bottom portion of the lens assembly is disposed within the immersion liquid.

5. The liquid immersion scanning system as set forth in claim 2 wherein the solid optical element comprises optical material having an index of refraction substantially equal to an index of refraction of the immersion liquid.

6. The liquid immersion scanning system as set forth in claim 3 wherein the lens assembly moves laterally within the immersion liquid within the watertight lens hood.

7. The liquid immersion scanning system as set forth in claim 6 wherein the immersion liquid comprises at least one of: water and argon fluoride.

8. A method for operating a liquid immersion scanning system, the method comprising:
providing a watertight lens hood;
providing a solid optical element as a base of the watertight lens hood;
placing, a lens assembly within the watertight lens hood;
providing a photoresist layer;
disposing the solid optical element of the watertight lens hood above a top surface of the photoresist layer, wherein the solid optical element is in direct contact with the top surface of the photoresist layer or is in direct contact with a buffer layer in direct contact with the top surface of the photoresist layer; and
operating the lens assembly within the watertight lens hood.

9. The method as set forth in claim 8 further comprising:
placing an immersion liquid within the watertight lens hood.

10. The method as set forth in claim 9 further comprising:
placing a bottom portion of the lens assembly within the immersion liquid within the watertight lens hood.

11. The method as set forth in claim 9 wherein the solid optical element comprises optical material having an index of refraction substantially equal to an index of refraction of the immersion liquid.

12. The method as set forth in claim 9 further comprising:
moving the lens assembly laterally within the immersion liquid within the watertight lens hood.

13. The method as set forth in claim 12 wherein the immersion liquid within the watertight lens hood comprises at least one of: water and argon fluoride.

14. The method as set forth in claim 8 wherein the buffer layer comprises an anti-adhesion film.

15. A method for operating a liquid immersion scanning system, the method comprising:
    providing a watertight lens hood having as bottom portion and a plurality of wall portions defining an interior volume, the bottom portion including a solid optical element positioned above a top surface of a photoresist material, wherein the solid optical element is in direct contact with top surface of the photoresist material or is in direct contact with a buffer layer in direct contact with the top surface of the photoresist material;
    placing an immersion liquid within the watertight lens hood;
    placing a lens assembly within the immersion liquid within the watertight lens hood; and
    operating the liquid immersion scanning system by moving, the lens assembly laterally within the immersion liquid within the watertight lens hood.

16. The method as set forth in claim 15 wherein the buffer layer comprises an anti-adhesion film.

17. A liquid immersion scanning system comprising:
    watertight lens hood having a bottom portion and a plurality of wall portions defining an interior volume, wherein the bottom portion of the watertight lens hood comprises a solid optical element positioned above a surface of a photoresist material, wherein the solid optical element is in direct contact with a buffer layer that is in direct contact with a top surface of the photoresist material.

18. The liquid immersion scanning system as set forth in claim 17 wherein the buffer layer comprises an anti-adhesion film.

19. The liquid immersion scanning system as set forth in claim 17 further comprising:
    an immersion liquid within the watertight lens hood; and
    a lens assembly at least partially disposed within the immersion liquid within the watertight lens hood.

20. The liquid immersion scanning system as set forth in claim 19 wherein the lens assembly moves laterally within the immersion liquid within the watertight lens hood.

\* \* \* \* \*